United States Patent
Sugawara

(10) Patent No.: US 9,484,442 B2
(45) Date of Patent: Nov. 1, 2016

(54) METHOD OF FABRICATING THIN-FILM TRANSISTOR SUBSTRATE

(71) Applicant: JOLED INC., Tokyo (JP)

(72) Inventor: Yuta Sugawara, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/952,251

(22) Filed: Nov. 25, 2015

(65) Prior Publication Data

US 2016/0155828 A1    Jun. 2, 2016

(30) Foreign Application Priority Data

Nov. 27, 2014 (JP) .................................. 2014-240410

(51) Int. Cl.
| | | |
|---|---|---|
| H01L 21/00 | (2006.01) | |
| H01L 29/66 | (2006.01) | |
| H01L 29/786 | (2006.01) | |
| H01L 21/02 | (2006.01) | |

(52) U.S. Cl.
CPC ... *H01L 29/66969* (2013.01); *H01L 21/02271* (2013.01); *H01L 21/02323* (2013.01); *H01L 21/02565* (2013.01); *H01L 21/02631* (2013.01); *H01L 29/78693* (2013.01)

(58) Field of Classification Search
CPC .................. H01L 29/66969; H01L 29/78693; H01L 29/7869; H01L 21/02271; H01L 21/02323; H01L 21/02565; H01L 21/02631
USPC .......................... 438/104, 151, 158, 294, 479
See application file for complete search history.

(56) References Cited

U.S. PATENT DOCUMENTS

| | | | | |
|---|---|---|---|---|
| 8,426,853 | B2* | 4/2013 | Saito | ................... H01L 27/1214 257/43 |
| 8,969,867 | B2* | 3/2015 | Yamazaki | ........... H01L 29/7869 257/347 |
| 2011/0215325 | A1* | 9/2011 | Yamazaki | ........... H01L 27/1203 257/57 |
| 2013/0137213 | A1* | 5/2013 | Egi | ................... H01L 29/78693 438/104 |
| 2013/0320338 | A1* | 12/2013 | Ono | ................... H01L 21/02554 257/43 |
| 2016/0079437 | A1* | 3/2016 | Ochi | ................... H01L 29/7869 257/43 |

FOREIGN PATENT DOCUMENTS

JP    2004-119645    4/2004

* cited by examiner

*Primary Examiner* — Kevin M Picardat
(74) *Attorney, Agent, or Firm* — Greenblum & Bernstein, P.L.C.

(57) ABSTRACT

A method of fabricating a TFT substrate in which a thin-film transistor is formed on a substrate, includes: forming an oxide semiconductor layer above the substrate; forming a first oxide film on the oxide semiconductor layer; performing an oxidation treatment on the oxide semiconductor layer, after the first oxide film is formed; and forming a second oxide film above the first oxide film, after the oxidation treatment is performed. In the performing of the oxidation treatment, at least one parameter of the oxidation treatment is set, based on a predetermined relationship between the at least one parameter and the threshold value of the thin-film transistor, so that the threshold value becomes a predetermined value.

12 Claims, 11 Drawing Sheets

FIG. 6

| Sample | N₂O plasma treatment conditions | | | TFT characteristics | | Channel protecting layer configuration |
|---|---|---|---|---|---|---|
| | Time | Power density | Time × Power density^2 | Vth | | |
| | | | | Ave | 3σ | |
| | sec | W/cm² | sec·(W/cm²)² | | | |
| A | 0 | — | 0.000 | 0.32 | 0.29 | Single-layered |
| B | 5 | 0.091 | 0.041 | 0.46 | 0.23 | Stacked |
| C | 15 | 0.091 | 0.124 | 0.57 | 0.25 | |
| D | 15 | 0.127 | 0.243 | 0.64 | 0.21 | |
| E | 5 | 0.182 | 0.165 | 0.59 | 0.24 | |
| F | 10 | 0.182 | 0.331 | 0.78 | 0.24 | |
| G | 15 | 0.182 | 0.496 | 0.86 | 0.26 | |
| H | 15 | 0.200 | 0.600 | 0.99 | 0.25 | |
| I | 20 | 0.200 | 0.800 | 1.03 | 0.31 | |
| J | 15 | 0.182 | 0.496 | 1.08 | 1.06 | Single-layered (*) |

\* N₂O plasma treatment prior to channel protection layer forming

METHOD OF FABRICATING THIN-FILM TRANSISTOR SUBSTRATE

CROSS REFERENCE TO RELATED APPLICATION

The present application is based on and claims priority of Japanese Patent Application No. 2014-240410 filed on Nov. 27, 2014. The entire disclosure of the above-identified application, including the specification, drawings and claims is incorporated herein by reference in its entirety.

FIELD

The present disclosure relates to a method of fabricating a thin-film transistor substrate which uses an oxide semiconductor.

BACKGROUND

Thin-film transistors (TFTs) are widely used as switching elements or drive elements in active-matrix display devices such as liquid-crystal display devices or organic electroluminescence (EL) display devices.

There have been proposed techniques for adjusting the threshold value (that is, the threshold voltage) of TFTs in the method of fabricating TFTs to be used as switching elements or drive elements. For example, Patent Literature (PTL 1) discloses a technique for adjusting the threshold value of a TFT to an appropriate value, by doping a channel layer made from polycrystalline silicon with boron during TFT fabrication.

CITATION LIST

Patent Literature

[PTL 1] Japanese Unexamined Patent Application Publication No. 2004-119645

SUMMARY

Technical Problem

Recent years have seen active advancement of research and development of configurations using oxide semiconductors, such as a zinc oxide (ZnO), an indium gallium oxide (InGaO), or an indium gallium zinc oxide (InGaZnO), in a channel layer of a TFT. A TFT in which an oxide semiconductor is used in the channel layer is characterized by having a small OFF current, having high carrier mobility even in an amorphous state, and allowing forming using a low temperature process.

As disclosed in PTL 1, fabrication methods that allow the threshold value of a TFT to be adjusted are known for TFTs using polycrystalline silicon in the channel layer. However, no such method is known for TFTs using an oxide semiconductor in the channel layer.

The present disclosure provides a method of fabricating a thin-film transistor substrate which allows the threshold value of a thin-film transistor in which an oxide semiconductor is used in the channel layer to be adjusted to a desired value.

Solution to Problem

In order to solve the aforementioned problem, a method of fabricating a thin-film transistor substrate according to an aspect of this disclosure is a method of fabricating a thin-film transistor substrate in which a thin-film transistor is formed on a substrate, and includes: forming an oxide semiconductor layer above the substrate; forming a first oxide film on the oxide semiconductor layer; performing an oxidation treatment on the oxide semiconductor layer, after the first oxide film is formed; and forming a second oxide film above the first oxide film, after the oxidation treatment is performed, wherein in the performing of the oxidation treatment, at least one parameter of the oxidation treatment is set, based on a predetermined relationship between the at least one parameter and a threshold value of the thin-film transistor, so that the threshold value becomes a predetermined value.

Advantageous Effects

The present disclosure is capable of providing a thin-film transistor substrate fabrication method which allows the threshold value of a thin-film transistor in which an oxide semiconductor is used in the channel layer to be adjusted to a desired value.

BRIEF DESCRIPTION OF DRAWINGS

These and other objects, advantages and features of the invention will become apparent from the following description thereof taken in conjunction with the accompanying drawings that illustrate a specific embodiment of the present invention.

FIG. 6 is a table for describing the relationship between plasma treatment conditions and the threshold value of a thin-film transistor according to the embodiment.

DESCRIPTION OF EMBODIMENT

Hereinafter, an embodiment is discussed in detail with reference to drawings as necessary. However, there are instances where excessively detailed description is omitted. For example, there are instances where detailed description of well-known matter and redundant description of substantially identical components are omitted. This is to facilitate understanding by a person of ordinary skill in the art by avoiding unnecessary verbosity in the subsequent description.

It is to be noted that the accompanying drawings and subsequent description are provided by the inventors to allow a person of ordinary skill in the art to sufficiently understand the present disclosure, and are thus not intended to limit the scope of the subject matter recited in the Claims.

Furthermore, the respective figures are schematic diagrams and are not necessarily precise illustrations. Furthermore, in the respective figures, the same numerical sign is given to identical structural components.

Moreover, in this Specification, the terms "above" and "below" do not refer to the upward (vertically upward) direction and downward (vertically downward) direction in terms of absolute spatial recognition, and are used as terms defined by relative positional relationships based on the stacking order of a stacked configuration. Furthermore, the terms "above" and "below" are applied not only when two structural components are disposed with a gap therebetween or when a separate structural component is interposed between two structural components, but also when two structural components are disposed in close contact with each other or when two structural components are in contact with each other.

Embodiment

[1. Organic EL Display Device]

Figure 1:
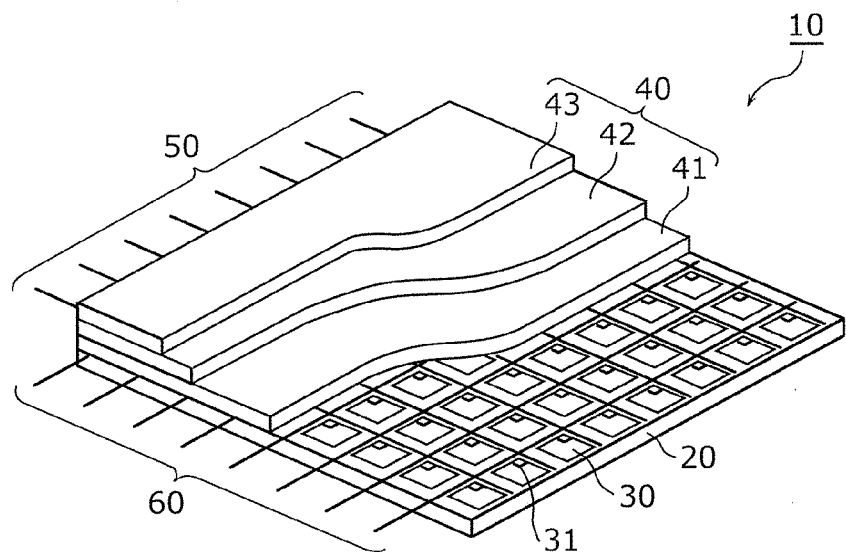
FIG. 1 is a partial cut-out perspective view of an organic EL display device according an embodiment.
Figure 2:
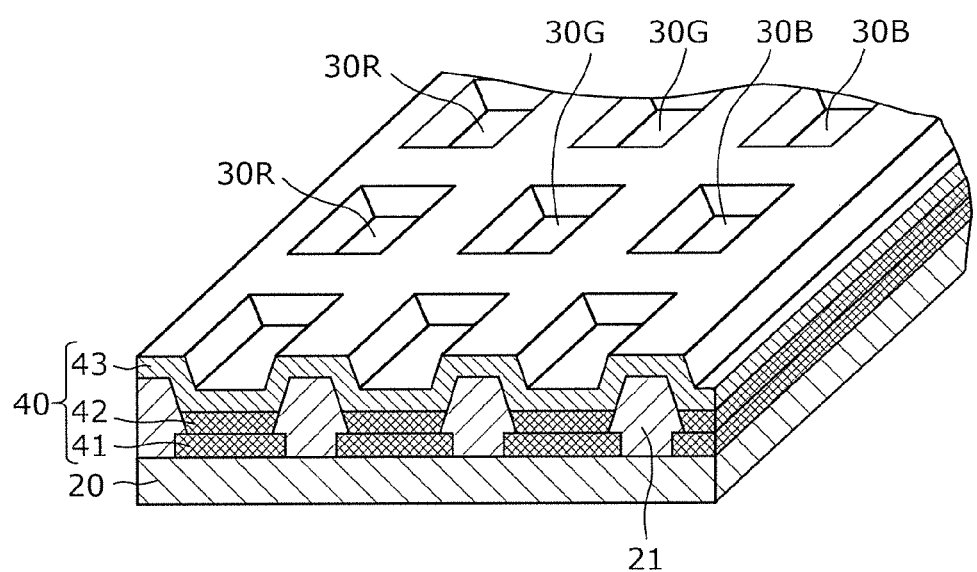
FIG. 2 is a perspective view of an example of pixel banks of the organic EL display device in the embodiment.

First, the configuration of an organic EL display device 10 according to the present embodiment will be described using FIG. 1 and FIG. 2. FIG. 1 is a partial cut-out perspective view of the organic EL display device 10 according to this embodiment. FIG. 2 is a perspective view of an example of pixel banks of the organic EL display device 10 according to this embodiment.

[1-1. Configuration]

As illustrated in FIG. 1, the organic EL display device 10 is configured of a stacked structure of: a TFT substrate (TFT array substrate) 20 in which plural thin-film transistors are disposed; and organic EL elements (light-emitting units) 40 each of which includes an anode 41 which is a lower electrode, an EL layer 42 which is a light-emitting layer configured from an organic material, and a cathode 43 which is a transparent upper electrode.

Plural pixels 30 are arranged in a matrix in TFT substrate 20, and pixel circuits 31 are provided in each of the pixels 30.

Each of the organic EL elements 40 is formed corresponding to a different one of the pixels 30, and control of the light emission of the organic EL element 40 is performed according to the pixel circuit 31 provided in the corresponding pixel 30. The organic EL elements 40 are formed on an interlayer insulating film (planarizing layer) formed to cover the thin-film transistors.

Furthermore, the organic EL elements 40 have a configuration in which the EL layer 42 is disposed between the anode 41 and the cathode 43. A hole transport layer is further formed stacked between the anode 41 and the EL layer 42, and an electron transport layer is formed stacked between the EL layer 42 and the cathode 43. It should be noted that another organic function layer may be provided between the anode 41 and the cathode 43.

Each of the pixels 30 is driven by the corresponding one of the pixel circuits 31. Furthermore, in the TFT substrate 20, plural gate lines (scanning lines) 50 are formed disposed along the row direction of the pixels 30, plural source lines (signal lines) are formed disposed along the column direction of the pixels 30 to cross with the gate lines 50, and plural power supply lines (not illustrated in FIG. 1) are formed disposed parallel to the source lines 60. The respective pixels 30 are partitioned by the crossing gate lines 50 and source lines 60, for example.

The gate lines 50 are connected, on a per-row basis, to the gate electrode of the thin-film transistors operating as switching elements included in the respective pixel circuits 31. The source lines 60 are connected, on a per-column basis, to the source electrode of the thin-film transistors operating as switching elements included in the respective pixel circuits 31. The power supply lines are connected, on a per-column basis, to the drain electrode of the thin-film transistors operating as switching elements included in the respective pixel circuits 31.

As illustrated in FIG. 2, each of the pixels 30 of the organic EL display device 10 is configured of subpixel 30R, 30G, or 30B of the thee colors (red, green, and blue), and a plurality of these subpixels 30R, 30G, and 30B are formed in a matrix on the display face. The respective subpixels 30R, 30G, and 30B are separated from each other by banks 21.

The banks 21 are formed in a lattice pattern such that protrusions running parallel to the gate lines 50 and protrusions running parallel to the source lines 60 cross each other. In addition, the respective portions surrounded by these protrusions (in other words, the openings of the banks 21) correspond, on a one-to-one basis, to the respective subpixels 30R, 30G, and 30B. It should be noted that although a pixel bank structure is adopted for the banks 21 in this embodiment, a line bank structure may be adopted.

The anode 41 is formed for each of the subpixels 30R, 30G, and 30B, at a position that is on the interlayer insulating film (planarizing layer) on the TFT substrate 20 and inside the opening of the bank 21. In the same manner, the EL layer 42 is formed for each of the subpixels 30R, 30G, and 30B, at a position that is on the anode 41 and inside the opening formed by the bank 21. The transparent cathode 43 is formed continuously on the banks 21 to cover the entire EL layer 42 (i.e., all the subpixels 30R, 30G, and 30B).

In addition, the pixel circuit 31 is provided on a per-subpixel basis, and each of the subpixels 30R, 30G, and 30B is connected to the corresponding pixel circuit 31 via a contact hole and a relay electrode. It should be noted that, aside from the difference in light-emission color of the EL layer 42, subpixels 30R, 30G, and 30B have the same configuration.

[1-2. Pixel Circuit]

Figure 3:
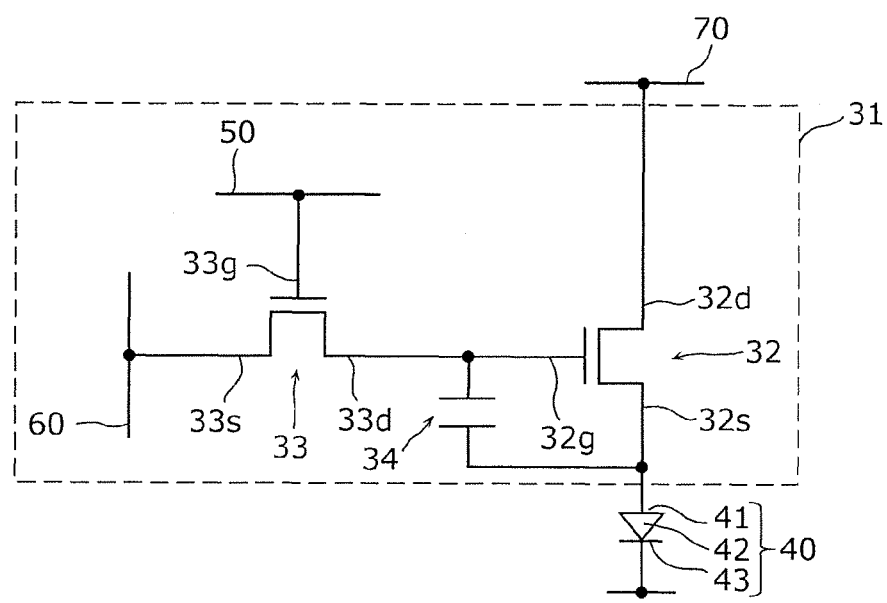
FIG. 3 is an electrical circuit diagram illustrating a configuration of a pixel circuit in the organic EL display device according to the embodiment.

Here, the circuit configuration of a pixel circuit 31 in a pixel 30 will be described using FIG. 3. FIG. 3 is an electrical circuit diagram illustrating the configuration of a pixel circuit 31 in organic EL display device 10 according to this embodiment.

As illustrated in FIG. 3, the pixel circuit 31 includes a thin-film transistor 32 that operates as a driver element, a thin-film transistor 33 that operates as a switching element, and a capacitor 34 that stores data voltage for the displaying by the corresponding pixel 30. In this embodiment, the thin-film transistor 32 is a drive transistor for driving the organic EL element 40, and the thin-film transistor 33 is a switching transistor for selecting the pixel 30.

The thin-film transistor 32 includes: a gate electrode 32g connected to a drain electrode 33d of thin-film transistor 33 and one end of capacitor 34; a drain electrode 32d connected to the power supply line 70; a source electrode 32s connected to the other end of capacitor 34 and the cathode 41 of organic EL element 40; and a semiconductor film (not illustrated in the figure). The thin-film transistor 32 supplies current corresponding to the data voltage held by the capacitor 34, from power supply line 70 to the anode 41 of organic EL element 40 via source electrode 32s. Accordingly, in the organic EL element 40, drive current flows from the anode 41 to the cathode 43, and the EL layer 42 emits light.

Thin-film transistor 33 includes: a gate electrode 33g connected to the gate line 50; a source electrode 33s connected to the source line 60; a drain electrode 33d connected to the one end of the capacitor 34 and the gate electrode 32g of the thin-film transistor 32; and a semiconductor film (not illustrated in the figure). When predetermined voltages are applied to the gate line 50 and source line 60 connected to the thin-film transistor 33, the voltage applied to the source line 60 is held as data voltage in the capacitor 34.

It should be noted that the organic EL display device 10 having the above-described configuration uses the active-matrix system in which display control is performed for each pixel 30 located at the cross-point between a gate line 50 and a source line 60. Accordingly, the thin-film transistors 32 and 33 of each pixel 30 (each subpixel 30R, 30G, or 30B) cause the corresponding organic EL element 40 to selectively emit light, and the desired image is displayed.

[2. TFT Substrate]

The TFT substrate 20 according to this embodiment will be described below using FIG. 4. It should be noted that the thin-film transistors formed in the TFT substrate 20 according to this embodiment are bottom-gate and channel-protective thin-film transistors.

Figure 4:
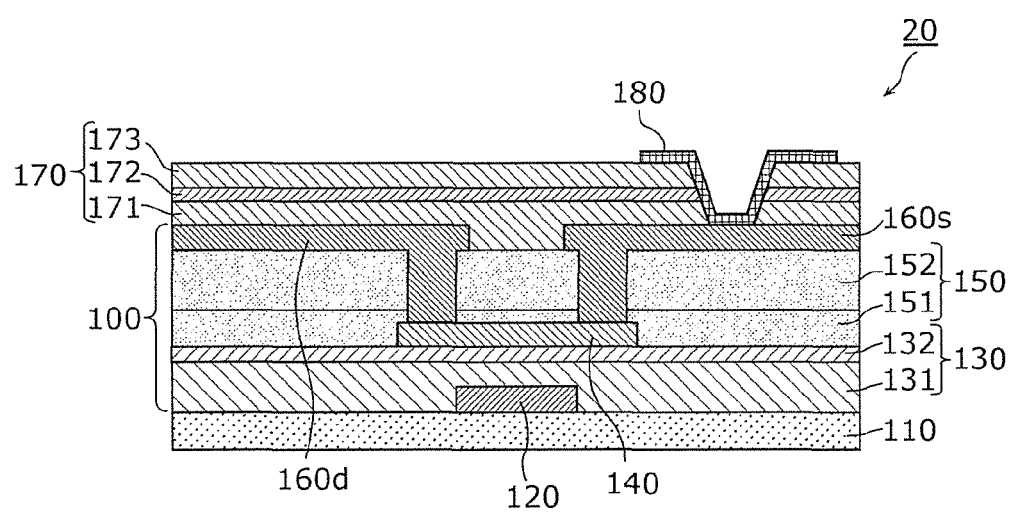
FIG. 4 is an outline cross-sectional view of an example of a thin-film transistor substrate according to the embodiment.

FIG. 4 is an outline cross-sectional view of the TFT substrate 20 according to this embodiment. Plural thin-film transistors 100, for example, are formed in TFT substrate 20.

As illustrated in FIG. 4, the TFT substrate 20 according to this embodiment includes a substrate 110, a gate electrode 120, a gate insulating layer 130, an oxide semiconductor layer 140, a channel protecting layer 150, a drain electrode 160d, a source electrode 160s, an interlayer insulating layer 170, and an upper electrode 180. It should be noted that, in the TFT substrate 20, each thin-film transistor 100 is configured of the gate electrode 120, the gate insulating layer 130, the oxide semiconductor layer 140, the channel protecting layer 150, the drain electrode 160d, and the source electrode 160s.

The thin-film transistor 100 is, for example, the thin-film transistor 32 illustrated in FIG. 3. In other words, thin-film transistor 100 can be used as a drive transistor. Specifically, when thin-film transistor 100 is the thin-film transistor 32, the gate electrode 120, the source electrode 160s, and the drain electrode 160d correspond to the gate electrode 32g, the source electrode 32s, and the drain electrode 32d, respectively.

It should be noted that the thin-film transistor 100 may be, for example, the thin-film transistor 33 illustrated in FIG. 3. In other words, thin-film transistor 100 may be used as a switching transistor.

[2-1. Substrate]

Substrate 110 is a substrate configured from an electrically insulating material. For example, the substrate 110 is a substrate configured from a glass material, such as alkali-free glass, quartz glass, or high-heat resistant glass; a resin material such as polyethylene, polypropylene, or polyimide; a semiconductor material such as silicon, gallium arsenide; or a metal material such as stainless steel coated with an insulating layer.

It should be noted that the substrate 110 may be a flexible substrate such as a resin substrate. In this case, the thin-film transistor 100 can be used in a flexible display, etc.

[2-2. Gate Electrode]

The gate electrode 120 is formed in a predetermined shape, on the substrate 110. The thickness of the gate electrode 120 is, for example, 30 nm to 400 nm. It should be noted that the gate electrode 120 may be formed above the substrate 110 via a buffer layer, etc.

The gate electrode 120 is an electrode configured from a conductive material. For example, for the material of the gate electrode 120, it is possible to use a metal such as molybdenum, aluminum, copper, tungsten, titanium, manganese, chromium, tantalum, niobium, silver, gold, platinum, palladium, indium, nickel, neodymium, etc.; a metal alloy; a conductive metal oxide such as indium tin oxide (ITO), aluminum doped zinc oxide (AZO), gallium doped zinc oxide (GZO), etc.; or a conductive polymer such as polythiophene, polyacetylene, etc. Furthermore, the gate electrode 120 may have a multi-layered structure obtained by stacking these materials.

[2-3. Gate Insulating Layer]

The gate insulating layer 130 is formed between the gate electrode 120 and the oxide semiconductor layer 140. Specifically, the gate insulating layer 130 is formed on the gate electrode 120 and on the substrate 110 to cover the gate electrode 120. The thickness of the gate insulating layer 130 is, for example, 210 nm to 500 nm.

The gate insulating layer 130 is configured from an electrically insulating material. For example, the gate insulating layer 130 is a single-layered film, such as a silicon oxide film, a silicon nitride film, a silicon oxynitride film, an aluminum oxide film, a tantalum oxide film, a hafnium oxide film, or a stacked film thereof.

In this embodiment, gate insulating layer 130 includes plural layers. Specifically, as illustrated in FIG. 4, gate insulating layer 130 has a two-layered structure and includes a first insulating film 131 and a second insulating film 132 which are sequentially stacked.

[2-3-1. First Insulating Film]

The first insulating film 131 is an insulating film provided on gate electrode 120. The first insulating film 131 serves as an adhesion layer with the gate electrode 120. In order to tightly adhere with the gate electrode 120, the first insulating film 131 requires compressive stress as membrane stress. It is preferable that the compressive stress be at least −400 MPa and at most −200 MPa. For example, first insulating film 131 is configured from a silicon nitride film. The thickness of the first insulating film 131 is, for example, 200 nm to 400 nm.

[2-3-2. Second Insulating Film]

The second insulating film 132 is an insulating film provided on the first insulating film 131. The second insulating film 132 is a layer that comes into contact with the oxide semiconductor layer 140. For example, the second insulating film 132 is configured from a silicon oxide film. The thickness of the second insulating film 132 is, for example, 10 nm to 100 nm, and is preferably 30 nm to 50 nm.

Configuring the second insulating film 132 from a silicon oxide film allows the amount of hydrogen (i.e., the hydrogen content) in the film to be reduced compared to when the second insulating film 132 is configured from a silicon nitride film, etc. Accordingly, it is possible to reduce the amount of hydrogen that is taken in by the oxide semiconductor layer 140 which is in contact with the second insulating film 132, and thus the lowering of the resistance of the oxide semiconductor layer 140 can be suppressed. It should be noted that, for the reasons indicated below, the gate insulating layer 130 may be formed entirely from a silicon oxide. Specifically, since it is difficult to control silicon oxide film stress by way of the film-forming conditions, in order to form a silicon oxide film that is of a level of fineness applicable to the thin-film transistor 100, an increase in the compressive stress of the silicon oxide film cannot be avoided. As such, if the gate insulating layer 130 is formed entirely from a silicon oxide film, the forming of the gate insulating layer 130 that is thick and has large compressive stress causes the substrate 110 to warp.

[2-4. Oxide Semiconductor Layer]

The oxide semiconductor layer 140 is formed above substrate 110 so as to be opposed to the gate electrode 120. Specifically, the oxide semiconductor layer 140 is formed on gate insulating layer 130, at a position opposite the gate electrode 120. For example, the oxide semiconductor layer 140 is formed in the shape of an island on the gate insulating layer 130 above gate electrode 120. The thickness of the oxide semiconductor layer 140 is, for example, 30 nm to 150 nm.

An oxide semiconductor material containing at least one from among indium (In), gallium (Ga), and Zinc (Zn), is used for the material of the oxide semiconductor layer 140. For example, oxide semiconductor layer 140 is configured from a transparent amorphous oxide semiconductor (TAOS) such as amorphous indium gallium zinc oxide (InGaZnO: IGZO).

The In:Ga:Zn ratio is, for example, approximately 1:1:1. Furthermore, although the In:Ga:Zn ratio may be in a range of 0.8 to 1.2:0.8 to 1.2:0.8 to 1.2, the ratio is not limited to this range.

The oxide semiconductor layer 140 is a channel layer of the thin-film transistor 100. A thin-film transistor having a channel layer configured from a transparent amorphous oxide semiconductor has high carrier mobility, and is suitable for a display device having a large screen and high definition. Furthermore, since a transparent amorphous oxide semiconductor allows low-temperature film-forming, a transparent amorphous oxide semiconductor can be easily formed on a flexible substrate of plastic or film, etc.

[2-5. Channel Protection Layer]

The channel protecting layer 150 is formed on the oxide semiconductor layer 140. For example, channel protecting layer 150 is formed on the oxide semiconductor layer 140 and on the gate insulating layer 130 to cover oxide semiconductor layer 140. The channel protecting layer 150 is an insulating layer provided in order to protect the oxide semiconductor layer 140. The thickness of the channel protecting layer 150 is, for example, 100 nm to 300 nm.

The channel protecting layer 150 includes plural layers. Specifically, as illustrated in FIG. 4, the channel protecting layer 150 has a two-layered structure and includes a first oxide film 151 and a second oxide film 152 which are sequentially stacked.

[2-5-1. First Oxide Film]

The first oxide film 151 is an insulating film provided on the oxide semiconductor layer 140. For example, the first oxide film 151 is a silicon oxide film. Alternatively, the first oxide film 151 may be an aluminum oxide film. The thickness of the first oxide film 151 is, for example, 5 nm to 40 nm.

[2-5-2. Second Oxide Film]

The second oxide film 152 is an insulating film provided on the first oxide film 151. For example, the second oxide film 152 is a silicon oxide film. Alternatively, the second oxide film 152 may be an aluminum oxide film. The thickness of the second oxide film 152 is such that the thickness of the channel protecting layer 150 is less than or equal to 300 nm, for example. In other words, the second oxide film 152 is of a thickness which together with the thickness of the first oxide film 151 results in a total of less than or equal to 300 nm.

It should be noted the first oxide film 151 and the second oxide film 152 may be configured from the same material, or may be configured from a different material.

Furthermore, contact holes for connecting the drain electrode 160d and the source electrode 160s to the oxide semiconductor layer 140 are provided in the first oxide film 151 and the second oxide film 152, respectively. The respective materials that form the drain electrode 160d and the source electrode 160s extend along the wall face of the contact holes and reach up to the oxide semiconductor layer 140. Alternatively, the respective materials that form the drain electrode 160d and the source electrode 160s may be filled into the contact holes.

[2-6. Drain Electrode and Source Electrode]

The drain electrode 160d and the source electrode 160s are formed on the channel protecting layer 150, in predetermined shapes. For example, the drain electrode 160d and the source electrode 160s are arranged opposing each other on the channel protecting layer 150, by being separated along a direction that is level with the channel protecting layer 150. Specifically, each of the drain electrode 160d and the source electrode 160s is formed on the channel protecting layer 150 so as to be connected with the oxide semiconductor layer 140 via the corresponding contact hole. The thickness of the drain electrode 160d and the source electrode 160s is, for example, 30 nm to 300 nm.

The drain electrode 160d and the source electrode 160s are electrodes configured from a conductive material. The drain electrode 160d and the source electrode 160s are configured of, for example, a single-layered film of copper (i.e., a Cu film), a stacked structure of a copper film and a tungsten film (Cu/W), a stacked structure of a copper film and a titanium nitride film (Cu/TiN), or a stacked structure of an alloy film of copper and manganese, a copper film, and a molybdenum film. Alternatively, a material that is the same as the material of the gate electrode 120 may be used for the drain electrode 160d and the source electrode 160s.

[2-7. Interlayer Insulating Layer]

The interlayer insulating layer 170 is formed above the channel protecting layer 150. Specifically, the interlayer insulating layer 170 is formed on the channel protecting layer 150, the drain electrode 160d, and the source electrode 160s. For example, the interlayer insulating layer 170 is formed on the channel protecting layer 150 and on the drain electrode 160d and the source electrode 160s to cover the drain electrode 160d and the source electrode 160s.

The interlayer insulating layer 170 is a passivation film of the thin-film transistor 100. The thickness of the interlayer insulating layer 170 is, for example, 200 nm to 500 nm.

Furthermore, a portion of the interlayer insulating layer 170 has an opening that passes through the interlayer insulating layer 170. Specifically, a contact hole for exposing a portion of the source electrode 160s is formed in the interlayer insulating layer 170.

The contact hole is formed to electrically connect the upper electrode 180 and the source electrode 160s. The material that forms the upper electrode 180, for example, extends along the wall face of the contact hole and reaches up to the source electrode 160s. Alternatively, the material that forms the upper electrode 180 may be filled into the contact hole.

The interlayer insulating layer 170 includes plural layers. Specifically, as illustrated in FIG. 4, the interlayer insulating layer 170 has a three-layered structure and includes a lower interlayer insulating layer 171, a barrier layer 172, and an upper interlayer insulating layer 173 which are sequentially stacked.

[2-7-1. Lower Interlayer Insulating Layer]

The lower interlayer insulating layer 171 is an insulating layer provided on the drain electrode 160d and the source electrode 160s. The thickness of the lower interlayer insulating layer 171 is such that the thickness of the interlayer insulating layer 170 is less than or equal to 500 nm.

The lower interlayer insulating layer 171 is configured from an electrically insulating material. For example, the lower interlayer insulating layer 171 is a film configured from an inorganic material, such as a silicon oxide film, a silicon nitride film, a silicon oxynitride film, an aluminum oxide film, or a single-layered film such as a film configured from an inorganic material containing silicon, oxygen, and carbon, or a stacked film thereof.

[2-7-2. Barrier Layer]

The barrier layer 172 is an insulating layer provided on the lower interlayer insulating layer 171. Barrier layer 172 is a layer for preventing airborne moisture, etc. from entering the oxide semiconductor layer 140 from the outside.

The barrier layer 172 is, for example, an alumina film. The thickness of the barrier layer 172 is, for example, 30 nm to 100 nm.

[2-7-3. Upper Interlayer Insulating Layer]

The upper interlayer insulating layer 173 is an insulating layer provided on the barrier layer 172. The thickness of the upper interlayer insulating layer 173 is such that the thickness of the interlayer insulating layer 170 is less than or equal to 500 nm.

The upper interlayer insulating layer 173 is configured from an electrically insulating material. For example, the upper interlayer insulating layer 173 is configured from the same material as the lower interlayer insulating layer 171.

[2-8. Upper Electrode]

The upper electrode 180 is formed above the drain electrode 160d and the source electrode 160s, in a predetermined shape. Specifically, the upper electrode 180 is formed on the interlayer insulating layer 170. The thickness of the upper electrode 180 is, for example, 200 nm to 500 nm.

The upper electrode 180 is connected to one of the drain electrode 160d and the source electrode 160s. Specifically, the upper electrode 180 is electrically connected to the source electrode 160s via a contact hole.

The upper electrode 180 is, for example, configured from the same material as the drain electrode 160d and the source electrode 160s. It should be noted that, in order to improve interlayer adhesion, an ITO film and a metal film may be stacked in this order.

[3. TFT substrate Fabrication Method]

Figure 5A:
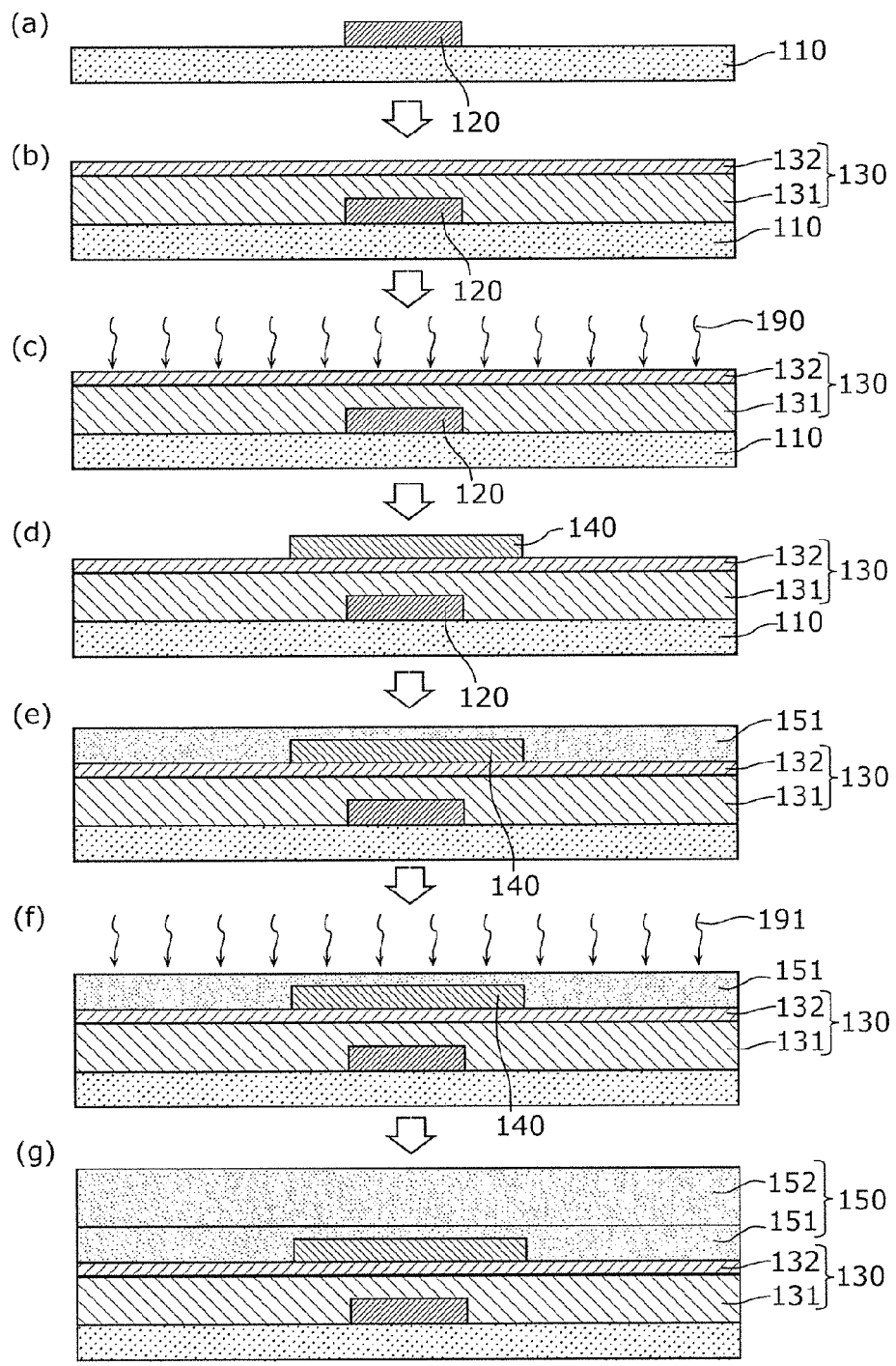
FIG. 5A is an outline cross-sectional view for illustrating a process of fabricating the thin-film transistor substrate according to the embodiment.
Figure 5B:
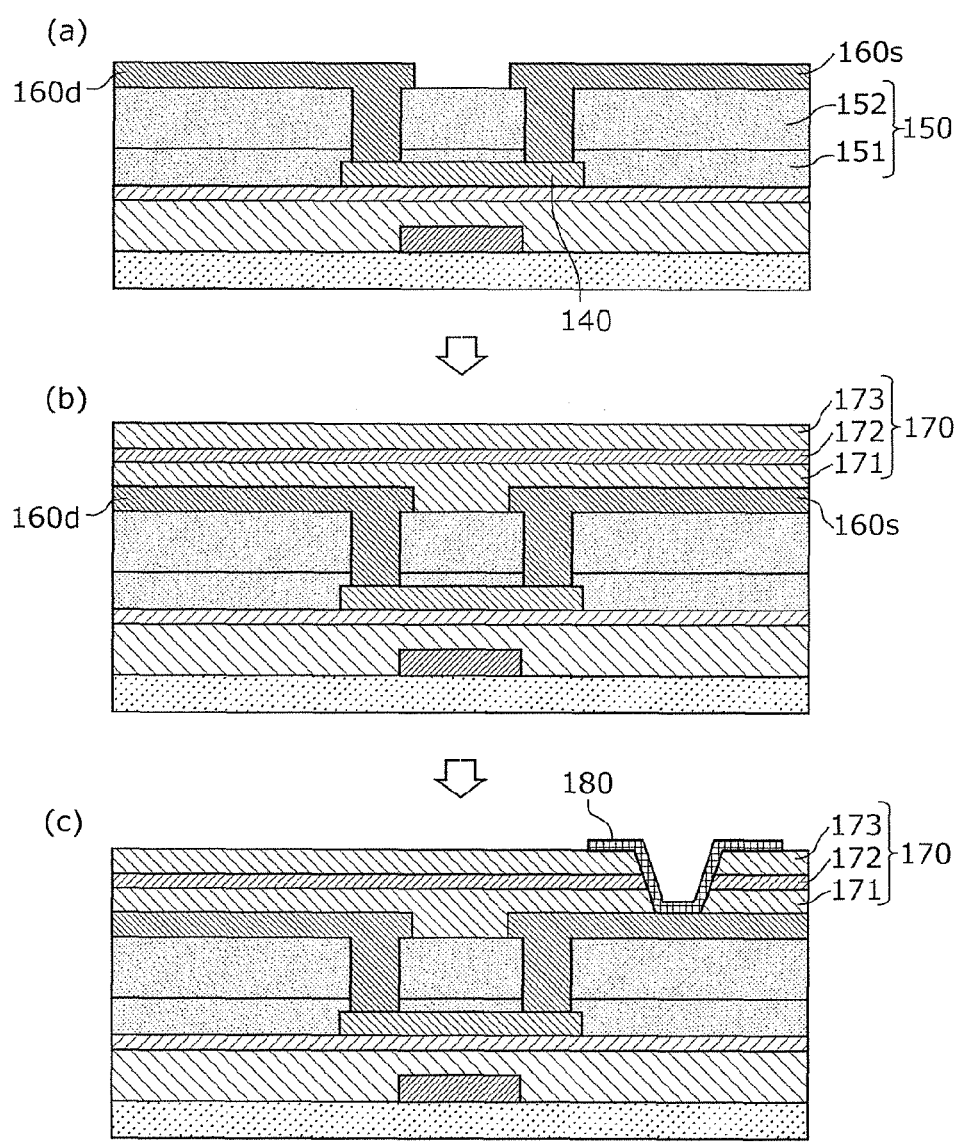
FIG. 5B is an outline cross-sectional view for illustrating a process of fabricating the thin-film transistor substrate according to the embodiment.

Next, the method of fabricating the TFT substrate 20 according to this embodiment will be described using FIG. 5A and FIG. 5B. FIG. 5A and FIG. 5B are outline cross-sectional views for describing the process of fabricating the TFT substrate 20 according to this embodiment.

[3-1. Forming the Gate Electrode]

First, as illustrated in (a) in FIG. 5A, the substrate 110 is prepared, and the gate electrode 120 of a predetermined shape is formed above the substrate 110. For example, a metal film is formed on the substrate 110 by sputtering, and the metal film is processed by photolithography and etching to form the gate electrode 20 of the predetermined shape.

Specifically, first, a glass substrate is prepared as the substrate 110, and a 20 nm Mo film and a 200 nm Cu film are sequentially formed on the substrate 110 by sputtering. Then, after a resist pattern is formed by photolithography, the Mo film and the Cu film are processed by wet etching to form the gate electrode 120.

It should be noted that the wet etching of the Mo film and the Cu film can be performed at room temperature by using, for example, a phosphoric-acetic-nitric-acid (PAN) solution. Furthermore, a stripping solution containing an alkaline additive may be used in the stripping of the resist. Furthermore, the substrate 110 is, for example, a Gen 8.5 glass substrate (thickness: 0.5 mm, X:2500 mm×Y:2200 mm).

[3-2. Forming the Gate Insulating Layer]

Next, as shown in (b) in FIG. 5A, the gate insulating layer 130 is formed above the substrate 110. For example, the gate insulating layer 130 is formed by plasma CVD or sputtering to cover the gate electrode 120. The gate insulating layer 130 is configured of the first insulating film 131 and the second insulating film 132.

Specifically, the gate insulating layer 130 is formed by sequentially forming the first insulating film 131 configured of a 350 nm silicon nitride film and the second insulating film 132 configured of a 50 nm silicon oxide film, above the substrate 110 to cover the gate 120. The film-forming temperature at this time is, for example, 350° C. to 400° C. When the film-forming temperature is below 350° C., the hydrogen content of the silicon nitride film increases, and is thus not desirable. For the amount of hydrogen bonding in the silicon nitride film, it is preferable that N—H bonds be less than or equal to $3.3 \times 10^{22}$ cm$^{-3}$, and Si—H bonds be $2.3 \times 10^{21}$ cm$^{-3}$.

The first insulating film 131 configured of a silicon nitride film can be formed by using, for example, nitrogen gas ($N_2$), ammonia gas ($NH_3$), and silane gas ($SiH_4$) as introduced gases. As specific film-forming conditions, for example: film-forming temperature is 380° C.; power density is 0.16 W/cm$^2$; process distance (inter-electrode distance) is 650 mil (0.65 inch); process pressure is 133.32 Pa; $N_2$ gas flow rate is 63,000 sccm; $NH_3$ gas flow rate is 25,000 sccm; and $SiH_4$ gas flow rate is 2,200 sccm.

The second insulating film 132 configured of a silicon oxide film can be formed by using, for example, nitrous oxide gas ($N_2O$), argon gas (Ar), and silane gas ($SiH_4$) as introduced gases. It should be noted that Ar gas is used as a dilution gas for $N_2O$ gas. With this, the gas is decomposed efficiently, a good oxide film is formed, and the amount of $N_2O$ used can be reduced. As specific film-forming conditions, for example: film-forming temperature is 380° C.; power density is 0.145 W/cm$^2$; process distance (inter-electrode distance) is 650 mil (0.65 inch); process pressure is 126.65 Pa; $N_2O$ gas flow rate is 83,000 sccm; Ar gas flow rate is 47,000 sccm; and $SiH_4$ gas flow rate is 1,100 sccm. It should be noted that the film-forming of the second insulating film 132 is performed consecutively with the film-forming of the first insulating film 131. In other words, after the first insulating film 131 is formed using a plasma CVD apparatus, the film-forming of the second insulating film 132 is performed without breaking the vacuum inside the chamber of the plasma CVD apparatus. This reduces the likelihood of impurities getting mixed in.

[3-3. Plasma Treatment]

Next, as illustrated in (c) in FIG. 5A, plasma treatment, which is an example of nitriding treatment performed on the second insulating film 132 of the gate insulating layer 130, is performed. Specifically, after the second insulating film 132 is formed, plasma treatment is performed before forming the oxide semiconductor layer 140.

Specifically, plasma 190 is generated using ammonia gas ($NH_3$), nitrogen gas ($N_2$), etc., inside the chamber used to form the second insulating film 132. Hydrogen atoms may be included in the gas used for plasma treatment. Because hydrogen atoms are included in the gas used for the plasma treatment, the dangling bonds at the surface of the silicon layer can be terminated, and the defect level at the interface with the oxide semiconductor layer 140 can be reduced. It should be noted that, since the hydrogen atoms that bond to the second insulating film 132 are to be used only for reducing the defect level at the interface with the oxide semiconductor layer 140, the amount of such hydrogen atoms is decisively smaller than the amount of hydrogen atoms separating from the first insulating layer 131. Therefore, the hydrogen atoms that bond to the second insulating film 132 have a negligible effect on the lowering of the resistance of the oxide semiconductor layer 140.

The time (i.e., duration) for which plasma 190 is generated, that is, the plasma treatment time is, for example, 30 sec to 60 sec. Furthermore, the plasma treatment temperature, that is, the substrate temperature is 350° C. to 400° C. Furthermore, the substrate temperature is the same as the film-forming temperature during the film-forming of the first insulating film 131. As specific plasma treatment conditions, for example: power density is 0.1 W/cm²; process distance (inter-electrode distance) is 600 mil (0.6 inch); process pressure is 160 Pa; $NH_3$ gas flow rate is 15,000 sccm. It should be noted that the plasma treatment is performed consecutively with the film-forming of the second insulating film 132. In other words, after the second insulating film 132 is formed using a plasma CVD apparatus, the plasma treatment is performed without breaking the vacuum inside the chamber of the plasma CVD apparatus. This reduces the likelihood of impurities getting mixed in.

[3-4. Forming the Oxide Semiconductor Layer]

Next, as illustrated in (d) in FIG. 5A, the oxide semiconductor layer 140 of a predetermined shape is formed at a position that is above substrate 110 and opposing the gate electrode 120. For example, an oxide semiconductor film is formed on the gate insulating layer 130 by sputtering. Then, the oxide semiconductor film is processed by photolithography and etching to form the oxide semiconductor layer 140 of the predetermined shape.

Specifically, a 90 nm amorphous InGaZnO film is formed on the gate insulating layer 130 by sputtering in an oxygen ($O_2$) and argon (Ar) mixed gas atmosphere, using a target material having an In:Ga:Zn composition ratio of 1:1:1. More specific film-forming conditions are, for example, in DC magnetron sputtering method: power is 12 kW; film-forming gas oxygen partial pressure is 4.5%; and film-forming rate is 100 nm/min.

Then, wet etching is performed on the amorphous InGaZnO film formed on the gate insulating layer 130 to form the oxide semiconductor layer 140. Wet etching of InGaZnO can be performed using, for example, a chemical obtained by mixing phosphoric acid ($H_3PO_4$), nitric acid ($HNO_3$), and a surface-active agent. Furthermore, a stripping solution containing an alkaline additive may be used in the stripping of the resist.

[3-5. Forming the First Oxide Film]

Next, as illustrated in (e) in FIG. 5A, the first oxide film 151 is formed on the oxide semiconductor layer 140. For example, the first oxide film 151 is formed by plasma CVD to cover the oxide semiconductor layer 140.

Specifically, the first oxide film 151 is formed by forming a 5 nm to 40 nm silicon oxide film above the gate insulating layer 130 so as to cover the oxide semiconductor layer 140. The film-forming temperature at this time is, for example, 220° C. to 260° C. The silicon oxide film can be formed by using, for example, silane gas ($SiH_4$) and nitrous oxide gas ($N_2O$) as introduced gases. It should be noted that tetraethyl orthosilicate (TEOS) can also be used as a film-forming gas. However, when TEOS and oxygen are used, the undecomposed carbon remaining in the interface between the first oxide film 151 and the oxide semiconductor layer 140 causes the level and the fixed charge of the interface to increase. Therefore, for example, $SiH_4$ gas and $N_2O$ gas are used as film-forming gases.

With regard to the flow rate ratio of $SiH_4$ gas to $N_2O$ gas, the film-forming rate increases (that is, film-forming accelerates) as the percentage of $SiH_4$ gas increases and productivity is improved. However, the amount of hydrogen radicals generated during film-forming and the amount of hydrogen in the silicon oxide film increase, thereby lowering of the resistance of the oxide semiconductor layer 140. Therefore, the percentage of $SiH_4$ gas may be small, and it is sufficient that the percentage of the flow rate of $SiH_4$ gas be less than or equal to 1.1% the total flow rate of $SiH_4$ gas and $N_2O$. It should be noted that, since adding argon gas, nitrogen gas, etc. as a dilution gas promotes the decomposition of $SiH_4$ gas, the film-forming rate can be increased. However, adding argon gas, nitrogen gas, etc. as a dilution gas causes damage to the oxide semiconductor layer 140 due to ion bombardment during film-forming. As such, loss of oxygen and an increase in carriers in the oxide semiconductor layer 140 lowers the resistance of the oxide semiconductor layer 140. Therefore, add argon gas, nitrogen gas, etc. need not be added as dilution gas.

As specific film-forming conditions, for example: power density is 0.238 W/cm²; process distance (inter-electrode distance) is 600 mil (0.6 inch); process pressure is 133.32 Pa; $N_2O$ gas flow rate is 88,500 sccm, and $SiH_4$ gas flow rate is 980 sccm.

[3-6. Plasma Treatment]

Next, as illustrated in (f) in FIG. 5A, plasma treatment, which is an example of oxidation treatment performed on the oxide semiconductor layer 140, is performed. Specifically, after the first oxide film 151 is formed, plasma treatment is performed before forming the second oxide film 152. With this, the oxygen defect in the interface between the oxide semiconductor layer 140 and the first oxide film 151 can be efficiently corrected. In this embodiment, the threshold value of the thin-film transistor 100 is adjusted by adjusting the amount of correction for the oxygen defect by adjusting the oxidation treatment parameters. The adjusting of the threshold value will be described in detail later.

Specifically, in the plasma treatment, plasma 191 is generated using nitrous oxide gas ($N_2O$), in the chamber used for the film-forming of the first oxide film 151. The time (i.e., duration) for which plasma 191 is generated, that is, the plasma treatment time is, for example, 5 sec to 30 sec. Furthermore, the plasma treatment temperature, that is, the substrate temperature is 220° C. to 260° C. For example, the substrate temperature is the same as the substrate temperature during the film-forming of the first oxide film 151. As specific plasma treatment conditions, for example: power density is 0.05 to 0.3 W/cm$^2$; process distance (inter-electrode distance) is 750 mil (0.75 inch); process pressure is 93.32 Pa; and N$_2$O gas flow rate is 30,000 sccm.

It should be noted that the plasma treatment is performed consecutively with the film-forming of the first oxide film 151. In other words, after the first oxide film 151 is formed using a plasma CVD apparatus, the plasma treatment is performed without breaking the vacuum inside the chamber of the plasma CVD apparatus. This reduces the likelihood of impurities getting mixed in.

[3-7. Forming the Second Oxide Film]

Next, as illustrated in (g) of FIG. 5A, the second oxide film 152 is formed on the first oxide film 151. For example, an approximately 200 nm silicon oxide film is formed on the first oxide film 151 to form the second oxide film 152. The film-forming temperature at this time is, for example, 220° C. to 260° C. For example, the film-forming temperature and the introduced gases are the same as in the case of the first oxide film 151.

In this manner, the forming of the first oxide film 151, the plasma treatment, and the forming of the second oxide film 152 can be performed inside the same chamber. Furthermore, the substrate temperature may be the same for all these processes. This facilitates the processing stage, and thus cost can be reduced.

It should be noted that details of the process conditions for each of the film-forming stage of the first oxide film 151, the plasma treatment stage, and the film-forming stage of the second oxide film 152 will be described later. Furthermore, after the second oxide film 152 is formed, heat treatment (annealing) at a predetermined temperature may be performed. For example, annealing may be performed at a temperature greater than or equal to the film-forming temperature, in a dry air or oxygen atmosphere. For example, the annealing temperature may be 350° C. Furthermore, the annealing time may be one hour, after the elapse of a substrate temperature stabilizing period of approximately seven minutes. This allows the oxygen defect in the oxide semiconductor layer 140 to be corrected, and thus allowing semiconductivity to be maintained. Furthermore, for the aforementioned dry air, the atmospheric pressure dew point may be lower than or equal to −70° C.

[3-8. Forming the Drain Electrode and the Source Electrode]

Next, as illustrated in (a) in FIG. 5B, the drain electrode 160d and the source electrode 160s are formed on the second oxide film 152 (channel protecting layer 150). Specifically, first, portions of the channel protecting layer 150 are removed by photolithography and dry etching to form contact holes. Specifically, contact holes for exposing portions of the oxide semiconductor layer 140 are formed in the channel protecting layer 150.

For example, when the first oxide film 151 and the second oxide film 152 are silicon oxide films, reactive ion etching (RIE) can be used. At this time, for example, carbon tetrafluoride (CF$_4$) and oxygen gas (O$_2$) can be used as etching gases. Parameters such as gas flow rate, pressure, applied power, frequency, etc. are set as appropriate depending on the substrate size, the thickness of the film to be etched, etc. For example, power density may be 0.255 W/cm$^2$, process pressure may be 50 Pa, O$_2$ gas flow rate may be 1300 sccm, and CF$_4$ gas flow rate may be 3800 sccm. Furthermore, a stripping solution containing an alkaline additive may be used in the stripping of the resist.

Then, metal films are formed above the channel protecting layer 150 by sputtering so as to fill in the contact holes that were formed. For example, a 20 nm Mo film, a 300 nm Cu film, and a 50 nm alloy film of copper and manganese (i.e., a CuMn film) are sequentially stacked on the channel protecting layer 150. Subsequently, the stacked metal films are processed by photolithography and etching to form the drain electrode 160d and the source electrode 160s of the predetermined shapes. Wet etching of the Mo film, Cu film, and CuMn film can be performed, for example, using a PAN solution at room temperature. Furthermore, a stripping solution containing an alkaline additive may be used in the stripping of the resist.

[3-9. Forming the Interlayer Insulating Layer]

Next, as indicated in (b) in FIG. 5B, the interlayer insulating layer 170 is formed. Specifically, first, the lower interlayer insulating layer 171 is formed by plasma CVD or sputtering to cover the drain electrode 160d and the source electrode 160s. For example, a 200 nm silicon oxide film is formed above the channel protecting layer 150 by plasma CVD to cover the drain electrode 160d and the source electrode 160s. As specific film-forming conditions, for example: film-forming temperature is 230° C.; power density is 0.238 W/cm$^2$; process distance (inter-electrode distance) is 600 mil (0.6 inch); process pressure is 133.32 Pa; N$_2$O gas flow rate is 88,500 sccm, and SiH$_4$ gas flow rate is 980 sccm.

Next, the barrier layer 172 is formed on the lower interlayer insulating layer 171 by plasma CVD, atomic layer deposition (ALD), sputtering, or the like. For example, a 30 nm aluminum oxide film is formed on the lower interlayer insulating layer 171 by sputtering to form the barrier layer 172. Specifically, the aluminum oxide film is formed by RF magnetron sputtering in an oxygen (O$_2$) and argon (Ar) mixed gas atmosphere, using an aluminum target. As film-forming conditions, for example: power is 30 kW; purity of aluminum target is 99.99%; flow rate ratio between film-forming gases Ar and O$_2$ is 1:1; and film-forming rate is 6.0 nm/min.

Next, the upper interlayer insulating film 173 is formed on the barrier layer 172 by plasma CVD or sputtering. Specifically, a 400 nm silicon nitride film is formed on the barrier layer 172 by plasma CVD to form the upper interlayer insulating film 173. As specific film-forming conditions, for example: film-forming temperature is 290° C.; power density is 0.238 W/cm$^2$; process distance (inter-electrode distance) is 600 mil (0.6 inch); process pressure is 133.32 Pa; N$_2$O gas flow rate is 88,500 sccm, and SiH$_4$ gas flow rate is 980 sccm.

It should be noted that, since the substrate is under vacuum during the film-forming of the interlayer insulating layer 170, the oxide semiconductor layer 140 becomes oxygen-deficient and resistance is lowered. As such, annealing is performed in a dry air or oxygen atmosphere after the film-forming to correct the oxygen defect. For example, the annealing temperature may be 300° C. Furthermore, the annealing time may be one hour, after the elapse of a substrate stabilizing period of approximately seven minutes. Furthermore, for the aforementioned dry air, the atmospheric pressure dew point may be lower than or equal to −70° C.

[3-10. Forming the Upper Electrode]

Next, as indicated in (c) in FIG. 5B, the upper electrode 180 is formed on the interlayer insulating layer 170 (i.e., the upper interlayer insulating film 173). Specifically, first, a portion of the interlayer insulating layer 170 is removed by photolithography and dry etching to form a contact hole. In other words, a contact hole for exposing a portion of the drain electrode 160*d* or the source electrode 160*s* is formed in the interlayer insulating layer 170.

For example, a portion of the interlayer insulating layer 170 is removed by dry etching such as RIE, etc. For example, carbon tetrafluoride ($CF_4$) and oxygen gas ($O_2$) can be used as etching gases. Parameters such as power density, pressure, gas flow rates, etc. are set as appropriate depending on the substrate size, the thickness of the film to be etched, etc. For example, power density may be 0.255 W/cm$^2$, process pressure may be 50 Pa, $O_2$ gas flow rate may be 1300 sccm, and $CF_4$ gas flow rate may be 3800 sccm. Furthermore, a stripping solution containing an alkaline additive may be used in the stripping of the resist.

Next, conductive films are formed above interlayer insulating layer 170 by sputtering so as to fill in the contact hole that was formed. For example, a 20 nm Mo film, a 300 nm Cu film, and a 50 nm CuMn film are sequentially stacked on the interlayer insulating layer 170. Subsequently, the stacked conductive films are processed by photolithography and etching to form the upper electrode of a predetermined shape. Wet etching of the Mo film, Cu film, and CuMn film can be performed, for example, using a PAN solution at room temperature. Furthermore, a stripping solution containing an alkaline additive may be used in the stripping of the resist.

After going through the above-described stages, the TFT substrate 20 illustrated in FIG. 4 is fabricated. It should be noted that, the organic EL element 40 is further stacked in a subsequent stage.

[4. Relationship Between Oxidation Treatment Conditions and Thin-Film Transistor Threshold Value]

Next, the relationship between the oxidation treatment conditions for the TFT substrate 20 and the threshold value Vth of the thin-film transistor 100 according to this embodiment is described. Specifically, as described above, the plasma treatment conditions applied to the first oxide film 151 during the fabrication of the TFT substrate 20 are changed, and the results of measuring the threshold value Vth of the thin-film transistor 100 is described.

The thin-film transistors 100, which are the measurement targets, are formed in a matrix on a Gen 8.5 glass substrate (thickness: 0.5 mm, X:2500 mm x Y:2200 mm). Here, the channel width W and channel length L of the thin-film transistors 100 are 12 μm and 13 μm, respectively. Furthermore, the first oxide film 151 of the measurement target thin-film transistors 100 has a thickness of 20 nm, and as film-forming conditions: power density is 0.238 W/cm$^2$; process distance (inter-electrode distance) is 600 mil (0.6 inch); process pressure is 133.32 Pa; $N_2O$ gas flow rate is 88,500 sccm, and $SiH_4$ gas flow rate is 980 sccm. Furthermore, the second oxide film 152 of the measurement target thin-film transistors 100 has a thickness of 180 nm and has the same film-forming conditions as the first oxide film 151. The plasma treatment conditions applied to the first oxide film 151 formed in the above-described manner are indicated in FIG. 6. FIG. 6 is a table for describing the relationship between plasma treatment conditions and the threshold values of the thin-film transistors 100 according to this embodiment.

As indicated in FIG. 6, thin-film transistor samples A to J are fabricated using ten patterns of $N_2O$ plasma treatment conditions. In this embodiment, among the $N_2O$ plasma treatment conditions, treatment time and power density have been changed. It should be noted that plasma treatment conditions that are not indicated in FIG. 6 are shared by all the samples, and process distance (inter-electrode distance) is 750 mil (0.75 inch), process pressure is 93.32 Pa, and $N_2O$ gas flow rate is 30,000 sccm. Furthermore, samples A and J are comparative samples of the thin-film transistors 100 according to this embodiment. Sample A has not undergone $N_2O$ plasma treatment. Furthermore, in sample 3, $N_2O$ plasma treatment is performed before forming the first oxide film 151. In other words, in sample J, $N_2O$ plasma treatment is performed on the surface of the oxide semiconductor layer 140 and the second insulating film 132. The remaining samples B to I are of thin-film transistors 100 according to this embodiment, and the second oxide film 152 is formed after $N_2O$ plasma treatment is performed on the first oxide film 151.

Figure 7A:
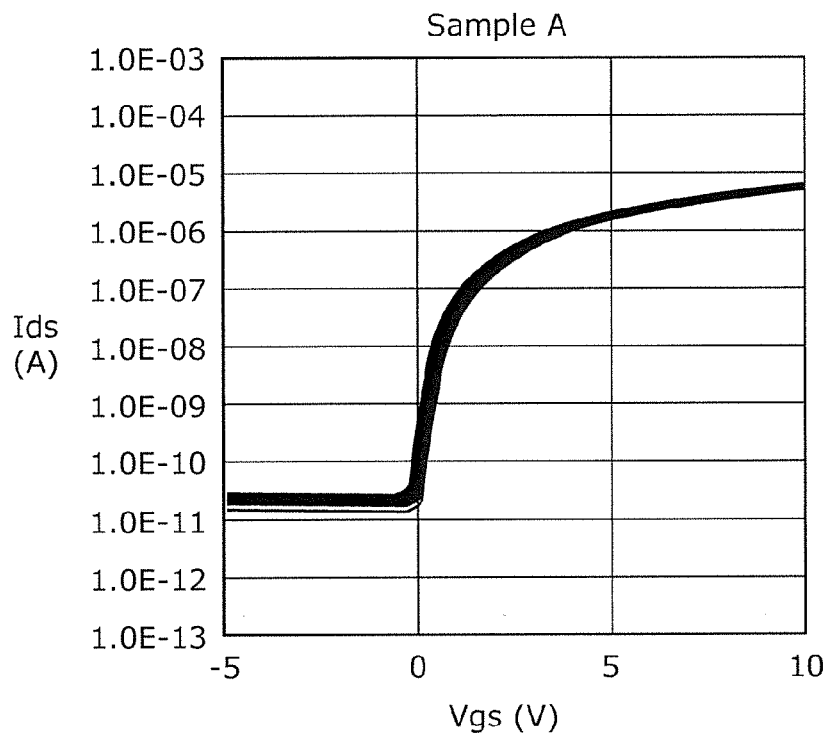
FIG. 7A is a graph illustrating the result of measuring electrical characteristics of sample A indicated in FIG. 6.
Figure 7B:
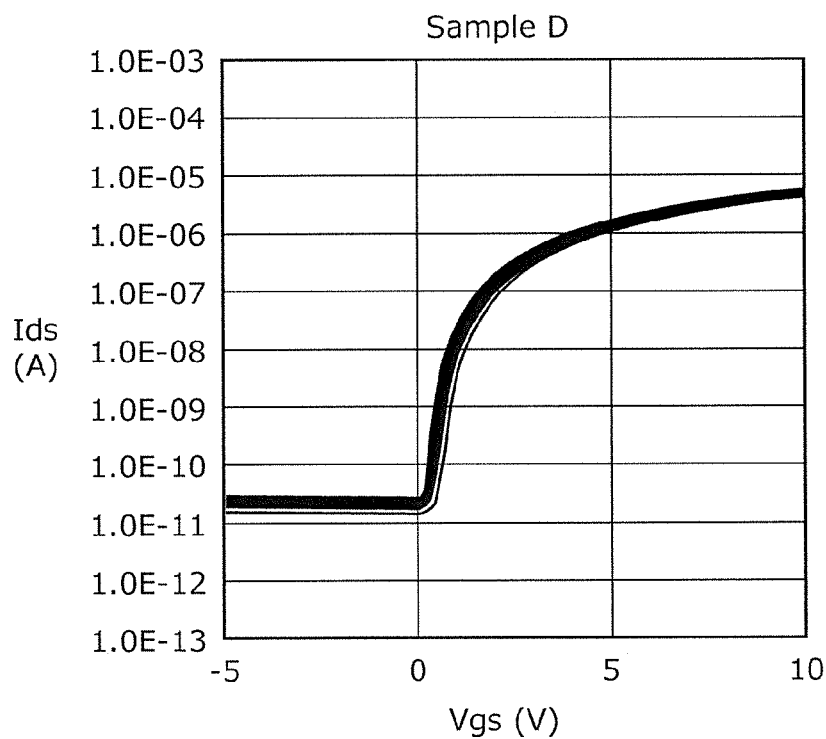
FIG. 7B is a graph illustrating the result of measuring electrical characteristics of sample D indicated in FIG. 6.
Figure 7C:
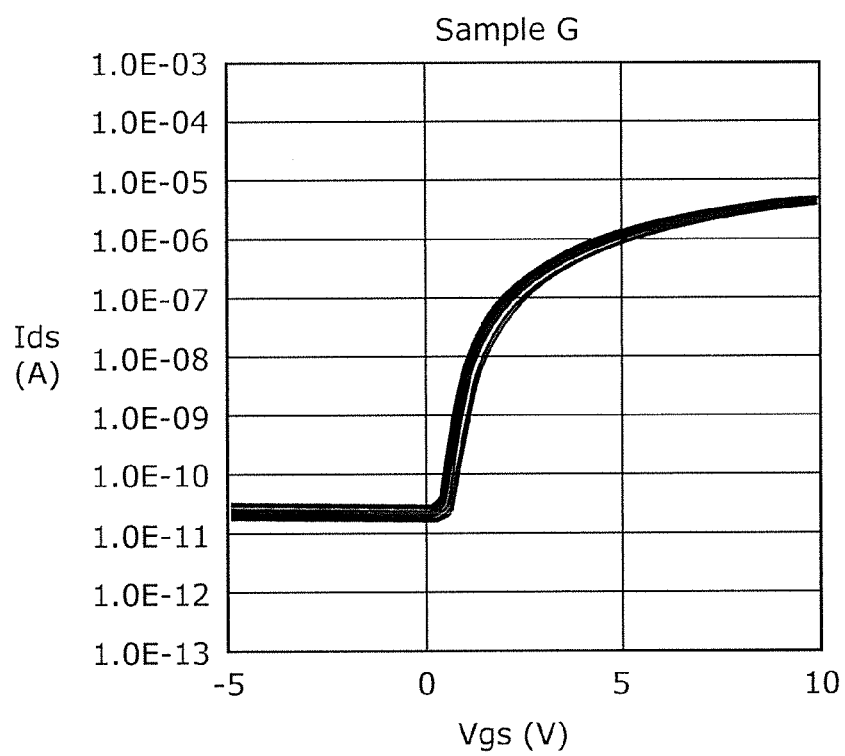
FIG. 7C is a graph illustrating the result of measuring electrical characteristics of sample G indicated in FIG. 6.

For each of the samples fabricated in the above described manner, electrical characteristics are measured in order to measure the threshold voltage Vth. Here, as electrical characteristics, the relationship between a gate-source voltage Vgs applied to each sample thin-film transistor and a current Ids flowing from the drain to the source is measured. Examples of the measured electrical characteristics are illustrated in FIG. 7A, FIG. 7B, and FIG. 7C. FIG. 7A, FIG. 7B, and FIG. 7C are graphs illustrating measurement results for the electrical characteristics of samples A, D, and G indicated in FIG. 6. In each of FIG. 7A, FIG. 7B, and FIG. 7C, an Ids-Vgs curve is drawn by obtaining the electrical characteristics at a total of 36 points consisting of 6 points on the long side and 6 points on the short side of an area of the TFT substrate 20 excluding the 200 mm portions from the edges. Then, the threshold value Vth of each curve is calculated assuming that the Vds at the time when Ids is W/L×10$^{-9}$ in the curve is the threshold value Vth (where W denotes channel width and L denotes channel length), and the average value (Ave) and variance (3σ) of the threshold values Vth are calculated. In the same manner, the results of calculating the average values (Ave) and variances (3σ) of the threshold values Vth for all the samples are indicated in FIG. 6.

Figure 8:
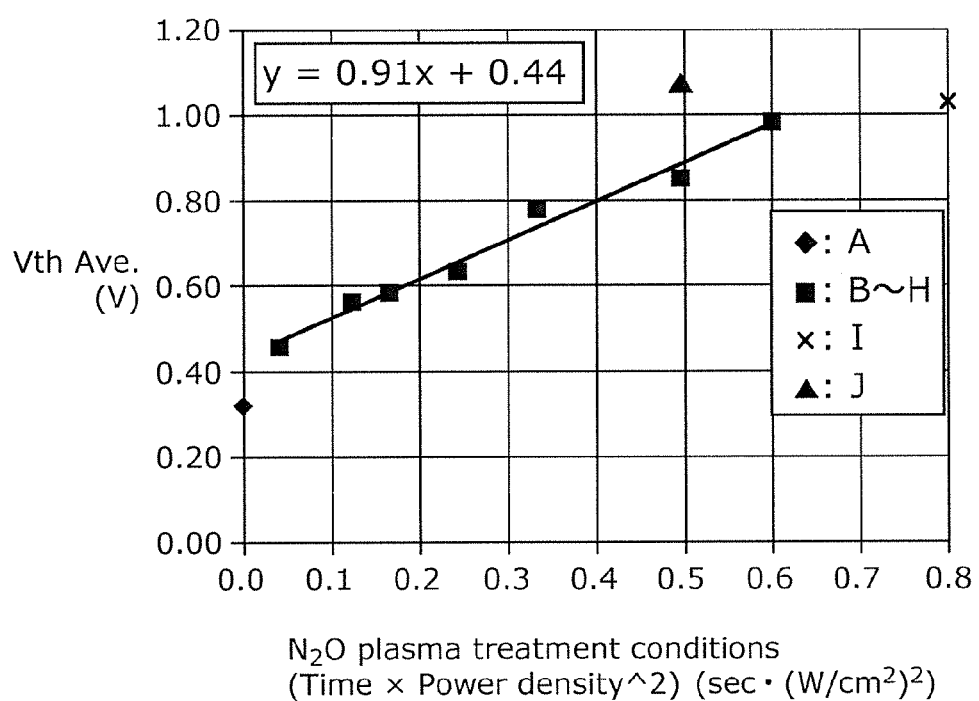
FIG. 8 is a graph illustrating the relationship between (i) the product of the $N_2O$ plasma treatment time and the square of the power density and (ii) the average value of threshold values Vth of thin-film transistors according to the embodiment.

Based on the results indicated in FIG. 6, the inventor has found a relationship between the $N_2O$ plasma treatment conditions and the average value of the threshold values Vth of the thin-film transistors 100. Specifically, the inventor has found that there is a linear relationship between the average value of the threshold values Vth of the thin-film transistors 100 and the product of the $N_2O$ plasma treatment time and a power of the power density (i.e., the power density raised to a power). This relationship is illustrated in FIG. 8. FIG. 8 is a graph illustrating the relationship between (i) the product of the $N_2O$ plasma treatment time and the square of the power density (i.e., the power density raised to the 2nd power) and (ii) the average value of threshold values Vth of the thin-film transistors 100 according to the embodiment. As illustrated in FIG. 8, for samples B to H, the relationship between (i) the product of the $N_2O$ plasma treatment time and the square of the power density and (ii) the average values of threshold values Vth of the thin-film transistors 100 can be approximated as a straight line having a slope of 0.91 and an intercept of 0.44 by using the least-squares method, etc.

It should be noted that, in FIG. 8, the measurement result for sample I is located below the straight line obtained from samples B to H. This is because, it is presumed that the increase in threshold value Vth caused by the $N_2O$ plasma treatment is in a saturated state. Furthermore, in sample I, the variance (3σ) of the threshold values Vth is also relatively big. Although the mechanism for the increase in the variance (3σ) of the threshold values Vth of sample I is not known, it is presumed that oxygen atoms excessively injected into the oxide semiconductor layer 140 are a factor for the fluctuation of threshold value characteristics. As described above, in the examples in this embodiment, control may be carried out so that the plasma treatment time is less than or equal to 15 sec and power density is less than or equal to 0.2 W/cm$^{-3}$. It should be noted that the aforementioned ranges for the plasma treatment time and power density are one example, and the preferred ranges are set as appropriate according to the configuration of the thin-film transistor 100, other plasma treatment conditions, etc.

Furthermore, as described above, sample J is a sample in which N$_2$O plasma treatment is performed before forming the first oxide film 151. As illustrated in FIG. 8, in sample J, the threshold value Vth also shifts to the positive side (i.e., rises) but, as indicated in FIG. 6, variance (3σ) of the threshold values Vth is at least three times the size of those in the other samples A to I. This is because, it is presumed that performing N$_2$O plasma treatment directly on the surface of the oxide semiconductor layer 140 causes plasma damage to the oxide semiconductor layer 140, causes the oxygen atoms in the surface or the bulk of the oxide semiconductor layer 140 to become detached, and thus causes electrical characteristics to deteriorate. Therefore, as in the thin-film transistor 100 according to this embodiment, the thin first oxide layer 151 may be formed on the surface of the oxide semiconductor layer 140 prior to the N$_2$O plasma treatment.

The slope of the aforementioned straight line changes according to the thickness, etc. of the first oxide film 151. For example, when the thickness is increased, the amount of permeation of oxygen atoms due to N$_2$O plasma decreases, and thus the slope is reduced. In other words, although N$_2$O plasma treatment needs to be performed for a longer time and with a higher power density in order for the oxygen atoms to reach the oxide semiconductor layer 140, there is the advantage that, since the slope is reduced, the controllability of threshold value Vth can be improved. On the other hand, when the thickness is decreased, the amount of permeation of oxygen atoms due to N$_2$O plasma increases, and thus the slope increases. In other words, it is sufficient to perform N$_2$O plasma treatment for a shorter time and with a lower power density in order for the oxygen atoms to reach the oxide semiconductor layer 140. However, the amount of oxygen defects that can be compensated in the oxide semiconductor layer 140 is limited, and even if N$_2$O plasma treatment is performed for a long time and with a high power density, the amount of positive shift for the threshold value Vth does not increase beyond the limit. However, since the amount of oxygen defects that can be compensated increases when the thickness of the oxide semiconductor layer 140 is increased, in such a case, reducing the thickness of the first oxide film 151 makes it possible to reduce the amount of N$_2$O plasma treatment needed in order to achieve the desired threshold value Vth. As described above, in the method of fabricating the TFT substrate 20 according to this embodiment, selecting the thickness of the first oxide film 151 appropriately according to the thickness of the oxide semiconductor layer 140 allows the controllability of the threshold value Vth to be adjusted flexibly.

Next, the specific procedure for adjusting the threshold value Vth of the thin-film transistor 100 will be described. First, before fabricating the TFT substrate 20, the relationship between (i) the product of the N$_2$O plasma treatment time and a power of the power density and (ii) the threshold value Vth of the thin-film transistor 100, such as that illustrated in FIG. 8, is calculated. Then, by setting the N$_2$O plasma treatment time and power density using this relationship so that the threshold voltage Vth of the thin-film transistor 100 becomes a predetermined value, it is possible to fabricate the TFT substrate 20 in which thin-film transistors 100 having the predetermined threshold value Vth are formed. Furthermore, in this embodiment, adjustment is easy because the relationship between (i) the product of the N$_2$O plasma treatment time and a power of the power density and (ii) the threshold value Vth is a linear relationship.

It should be noted that the detailed mechanism for bringing about the linear relationship such as that described above is not known. However, it can be assumed that the injection amount of oxygen atoms injected into the oxide semiconductor layer 140 increases linearly with respect to the plasma treatment time, and it is presumed that the threshold value Vth also increases linearly according to the injection amount of the oxygen atoms. On the other hand, it can be assumed that, when the plasma treatment power density is increased, the amount of oxygen atoms irradiated on the first oxide film 151 per unit time increases exponentially. Here, in order for the irradiated oxygen atoms to reach the oxide semiconductor layer 140, the oxygen atoms need to penetrate through the first oxide film 151 on the oxide semiconductor layer 140. It is speculated that, since the oxygen atoms irradiated on the first oxide film 151 are inhibited from entering the oxide semiconductor layer 140 by the first oxide film 151, even if the amount of oxygen atoms irradiated increases exponentially, in the end, the amount of oxygen atoms that are injected into the oxide semiconductor layer 140 increases in proportion to a power (in this embodiment, the 2nd power or square) of the power density for the plasma treatment. Furthermore, it is believed that this relationship changes according to the thickness of the first oxide film 151 and the plasma treatment conditions. Therefore, when the threshold value Vth is to be adjusted, it is preferable to adopt a thickness and material for the first oxide film 151 as well as plasma treatment conditions, etc., that provide good threshold value Vth controllability (i.e., allow for bigger process margins).

[5. Summary]

As described above, the method of fabricating the TFT substrate 20 according to this embodiment is a method of fabricating a TFT substrate 20 in which a thin-film transistor 100 is formed on a substrate 110, and includes: forming an oxide semiconductor layer 140 above the substrate 110; forming a first oxide film 151 on the oxide semiconductor layer 140; performing an oxidation treatment on the oxide semiconductor layer 140, after the first oxide film 151 is formed; and forming a second oxide film 152 above the first oxide film 151, after the oxidation treatment is performed, wherein in the performing of the oxidation treatment, at least one parameter of the oxidation treatment is set, based on a predetermined relationship between the at least one parameter and a threshold value of the thin-film transistor 100, so that the threshold value becomes a predetermined value.

In this manner, in the method of fabricating the TFT substrate 20 according to this embodiment, forming two oxide films on the oxide semiconductor layer 140 allows the correction of the oxygen defect in the oxide semiconductor layer 140, that is, the adjustment of the threshold value, to be performed via the first oxide film 151. Furthermore, by obtaining the predetermined relationship between the at least one parameter (hereafter also referred to simply as the parameter) of the oxidation treatment and the threshold value of the thin-film transistor 100, and setting the parameter of the oxidation treatment, based on the relationship, to obtain a desired threshold value, it is possible to fabricate the TFT substrate 20 including the thin-film transistor 100 having the desired threshold value. Furthermore, in this embodiment, the oxidation treatment is performed after the first oxide film 151 is formed on the oxide semiconductor layer 140, and thus the oxygen defect in the interface between the oxide semiconductor layer 140 and the first oxide film 151 can be efficiently corrected while suppressing damage to the oxide semiconductor layer 140. Furthermore, the method of fabricating the TFT substrate 20 according to this embodiment does not significantly increase the process load, and thus has excellent productivity.

Furthermore, for example, the oxidation treatment may be a plasma treatment.

Accordingly, since the oxygen defect in the interface between the oxide semiconductor layer 140 and the first oxide film 151, and in the oxide semiconductor layer 140 can be appropriately corrected, the threshold value of the thin-film transistor 100 can be adjusted to the desired value. Furthermore, when at least one of the first oxide film 151 and the second oxide film 152 is formed by plasma CVD, plasma treatment can be performed consecutively after the forming of the at least one of the first oxide film 151 and the second oxide film 152. Accordingly, since the film-forming and plasma treatment can be performed consecutively without breaking the vacuum inside the chamber of the plasma CVD apparatus, the likelihood of impurities getting mixed-in inside the chamber can be reduced.

Furthermore, for example, the at least one parameter for the oxidation treatment may include a treatment time for the plasma treatment.

In this manner, in the case where the treatment time for the plasma treatment is used as the parameter for the oxidation treatment, since the treatment time and the threshold value have a linear relationship, the threshold value of the thin-film transistor 100 can easily be adjusted to the desired value.

Furthermore, for example, the at least one parameter for the oxidation treatment may include a power density for the plasma treatment.

In this manner, in the case where the power density for the plasma treatment is used as the parameter for the oxidation treatment, since a power of the power density and the threshold value have a linear relationship, the threshold value of the thin-film transistor 100 can easily be adjusted to the desired value.

Furthermore, for example, the at least one parameter for the oxidation treatment may include a treatment time for the plasma treatment and a power density for the plasma treatment, and the predetermined relationship may be a linear relationship between (i) a product of a power of the power density and the treatment time and (ii) the threshold value.

Accordingly, since (i) the product of a power of the power density and the treatment time and (ii) the threshold value have a linear relationship, the threshold value of the thin-film transistor 100 can easily be adjusted to the desired value. Furthermore, since it is possible to adjust the two parameters, the power density and the treatment time, parameter setting flexibility can be improved. Furthermore, for example, the predetermined relationship may be a linear relationship between (i) the product of the square of the power density and the treatment time and (ii) the threshold value.

Furthermore, for example, the plasma treatment may be performed using nitrous oxide gas.

Accordingly, the oxygen defect in the oxide semiconductor layer 140 can be appropriately corrected.

Furthermore, for example, the plasma treatment may be performed for a treatment time of at least 5 seconds and at most 15 seconds.

Accordingly, the aforementioned relationship can be maintained without the amount of correction for the oxygen defect in the oxide semiconductor layer 140 by the plasma treatment being saturated.

Furthermore, for example, the first oxide film 151 may have a thickness of at least 5 nm and at most 40 nm.

Accordingly, the oxygen atoms injected into the first oxide film 151 in the oxidation treatment pass through the first oxide film 151 and are injected into the oxide semiconductor film 140. Therefore, the oxygen defect in the oxide semiconductor layer 140 can be appropriately corrected.

Furthermore, for example, the first oxide film 151 may be configured of a silicon oxide film.

Furthermore, for example, the oxide semiconductor layer 140 may be configured of a transparent amorphous oxide semiconductor.

Furthermore, for example, the oxide semiconductor layer 140 may be configured of InGaZnO.

(Variation)

Figure 9A:
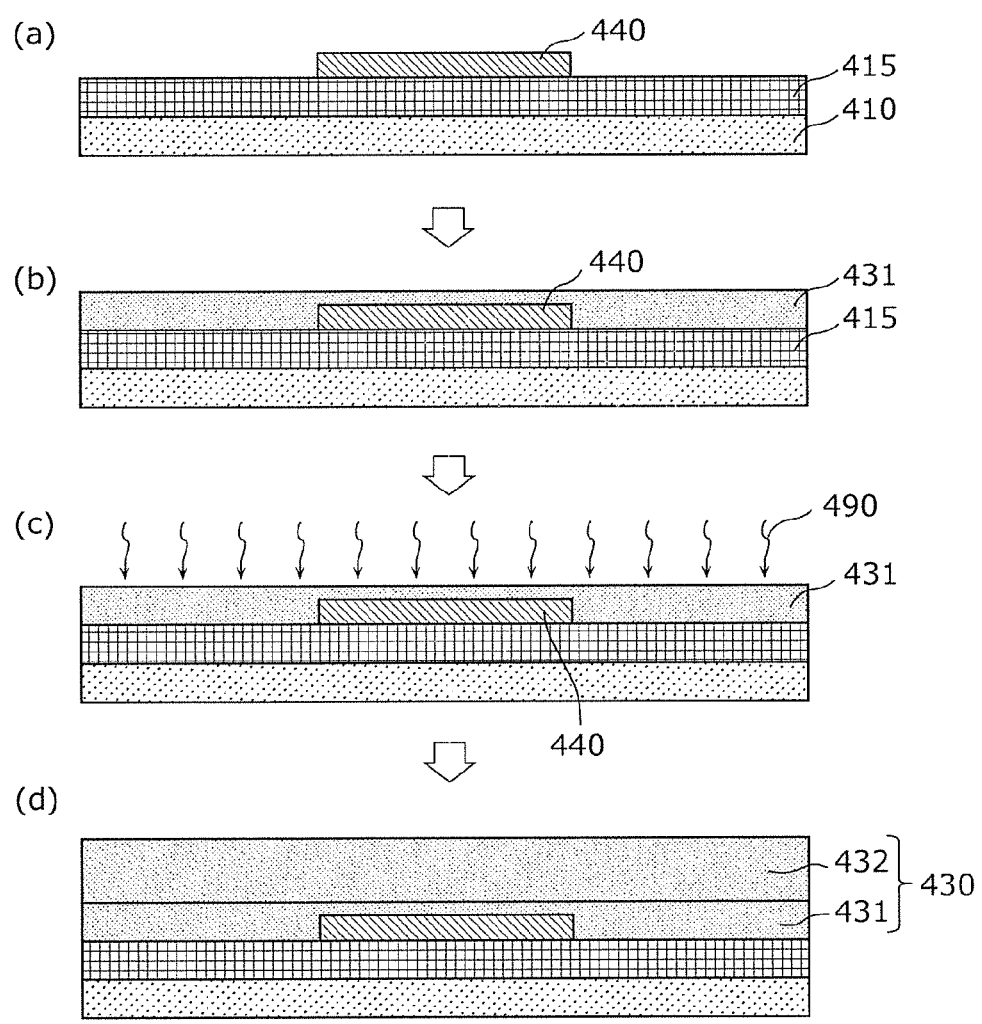
FIG. 9A is an outline cross-sectional view for illustrating a method of fabricating a thin-film transistor substrate according to a variation of the embodiment.
Figure 9B:
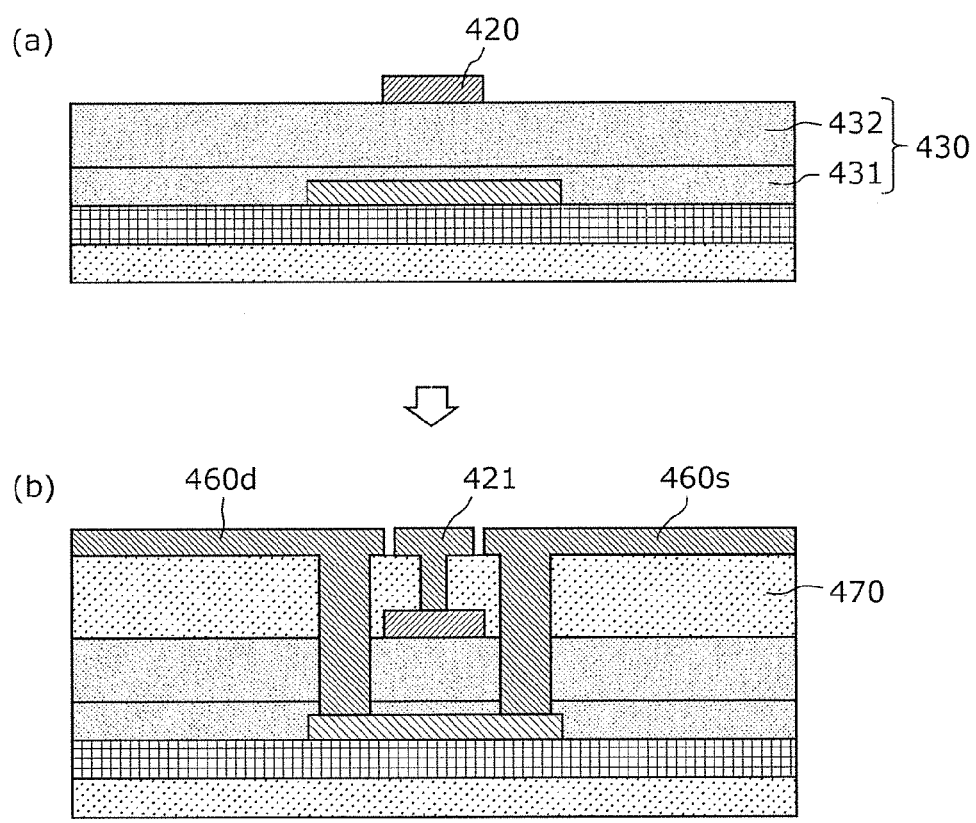
FIG. 9B is an outline cross-sectional view for illustrating a method of fabricating a thin-film transistor substrate according to the variation of the embodiment.

Although an example in which the thin-film transistors are of the bottom-gate type is described in the foregoing embodiment, the thin-film transistors may be of the top-gate type. In this variation, a method of manufacturing a top-gate thin-film transistor 400 will be described using FIG. 9A and FIG. 9B. FIG. 9A and FIG. 9B are outline cross-sectional views for describing the method of fabricating the thin-film transistor 400 according to a variation of this embodiment.

[Buffer Layer Configuration]

First, as illustrated in (a) in FIG. 9A, a substrate 410 is prepared, and a buffer layer 415 is formed on the substrate 410. For example, an insulating film is formed on the substrate 410 by plasma CVD.

Specifically, first, a glass substrate is prepared as the substrate 410, and a silicon oxide film, a silicon nitride film, or a silicon oxynitride film, or a stacked film thereof is formed on the substrate 410, as the buffer layer 415. The thickness of the buffer layer 415 is approximately 100 nm to 300 nm. The film-forming temperature at this time is, for example, 350° C. to 400° C.

It should be noted that providing the buffer layer 415 improves the adhesion between an oxide semiconductor layer 440 and the substrate 410. Furthermore, providing the buffer layer 415 inhibits the elements making up the substrate 410 from spreading to the oxide semiconductor layer 440.

[Forming the Oxide Semiconductor Layer]

In addition, the oxide semiconductor layer 440 of a predetermined shape is formed above the substrate 110, that is, on the buffer layer 415. For example, an oxide semiconductor film is formed on the buffer layer 415 by sputtering. Then, the oxide semiconductor film is processed by photolithography and etching to form the oxide semiconductor layer 440 of the predetermined shape. The specific film-forming conditions and processing conditions are the same as the film-forming conditions and processing conditions for the oxide semiconductor layer 140 according to the foregoing embodiment.

[Forming a First Oxide Film]

Next, as illustrated in (b) in FIG. 9A, a first oxide film 431 is formed on the oxide semiconductor layer 440. For example, the first oxide film 431 is formed by plasma CVD to cover the oxide semiconductor layer 440.

Specifically, the first oxide film 431 is formed by forming a 5 nm to 40 nm silicon oxide film on the buffer layer 415 so as to cover the oxide semiconductor layer 440. The film-forming temperature at this time is, for example, 220° C. to 260° C. The silicon oxide film can be formed by using, for example, silane gas (SiH$_4$) and nitrous oxide gas (N$_2$O) as introduced gases.

[Plasma Treatment]

Next, as illustrated in (c) in FIG. 9A, plasma treatment, which is an example of oxidation treatment, is performed. Specifically, after the first oxide film 431 is formed, plasma treatment is performed before forming a second oxide film 432.

Specifically, plasma 490 is generated using nitrous oxide gas (N$_2$O), in the chamber used for the film-forming of the first oxide film 431. The time (i.e., duration) for which plasma 190 is generated, that is, the plasma treatment time is, for example, 5 sec to 30 sec. Furthermore, the plasma treatment temperature, that is, the substrate temperature is 220° C. to 260° C.

[Forming the Second Oxide Film]

Next, as illustrated in (d) of FIG. 9A, a second oxide film 432 is formed on the first oxide film 431. For example, a 200 nm silicon oxide film is formed on the first oxide film 431 to form the second oxide film 432. The film-forming temperature at this time is, for example, 220° C. to 260° C. For example, the introduced gases, etc. are the same as in the film-forming of the first oxide film 134. Furthermore, the film-forming temperature is, for example, the same as the substrate temperature in the plasma treatment.

It should be noted that the first oxide film 431 and the second oxide film 432 are the gate insulating layers of the thin-film transistor 400. After the second oxide film 432 is formed, heat treatment (annealing) at a predetermined temperature may be performed.

[Forming a Gate Electrode]

First, as illustrated in (a) in FIG. 9B, a gate electrode 420 of a predetermined shape is formed above the substrate 410. For example, a 30 nm to 400 nm metal film is formed on a gate insulating layer 430 by sputtering, and the metal film is processed by photolithography and etching to form the gate electrode 420 of the predetermined shape. The specific film-forming conditions and processing conditions are the same as the film-forming conditions and processing conditions for the gate electrode 120 according to the foregoing embodiment.

[Forming an Interlayer Insulating Layer]

Next, as indicated in (b) in FIG. 9B, an interlayer insulating layer 470 is formed. The interlayer insulating layer 470 has, for example, the same three-layer structure as the interlayer insulating layer 170 according to the foregoing embodiment. The specific film-forming conditions are the same as the film-forming conditions for the interlayer insulating layer 170 according to the foregoing embodiment.

[Forming an Upper Electrode, a Drain Electrode and a Source Electrode]

Next, as illustrated in (b) in FIG. 9B, an upper electrode 421, a drain electrode 460d, and a source electrode 460s are formed on the interlayer insulating layer 470. Specifically, first, portions of the interlayer insulating layer 470 are removed to form contact holes. Specifically, contact holes for exposing a portion of the gate electrode 420 and portions of the oxide semiconductor layer 440 are formed in the interlayer insulating layer 470. The specific processing conditions are the same as the processing conditions for the interlayer insulating layer 170 according to the foregoing embodiment.

Then, metal films are formed on the channel protecting layer 470 by sputtering so as to fill in the contact holes that were formed. For example, a 20 nm Mo film, a 300 nm Cu film, and a 50 nm alloy film of copper and manganese (i.e., a CuMn film) are sequentially stacked on the channel protecting layer 150. Subsequently, the stacked metal films are processed by photolithography and etching to form the upper electrode 421, the drain electrode 460d, and the source electrode 460s of the predetermined shapes. The wet etching of the Mo film, the Cu film, and the CuMn film can be performed, for example, by using a PAN solution.

After going through the above-described stages, the top-gate thin-film transistor 400 is fabricated. It should be noted that, the organic EL element 40 is further stacked in a subsequent stage.

As in the case of the bottom-gate thin-film transistor 100, in the top-gate thin-film transistor 400, the threshold value Vth can also be adjusted through the oxidation treatment (in this embodiment, the N$_2$O plasma treatment).

Other Embodiments

As described above, the embodiment is described as an exemplification of the technique disclosed in the present application. However, the technique according to the present disclosure is not limited to the foregoing embodiments, and can also be applied to embodiments to which a change, substitution, addition, or omission is executed as necessary.

Hereinafter, other embodiments are exemplified.

For example, oxidation treatment is not limited to the N$_2$O plasma treatment described as an example in the foregoing embodiment. Oxygen plasma treatment using oxygen gas (O$_2$) instead of N$_2$O may be used. Accordingly, for example, when silane gas and oxygen gas are used as film-forming gases for a silicon oxide film, performing oxygen plasma treatment using oxygen gas allows film-forming and plasma treatment to be performed successively in the same chamber. Therefore, apparatus simplification, cost reduction, and other production conveniences can be enhanced.

Furthermore, instead of plasma treatment, gas treatment using an oxidizing gas or heat treatment (annealing) in which heating is performed at a predetermined temperature may be performed as an oxidation treatment. Furthermore, the relationship between the oxidation treatment parameters and the threshold value Vth of the thin-film transistor 100 may be a relationship other than a linear relationship.

Furthermore, for example, the first oxide film 151 and the second oxide film 152 are not limited to the examples given the foregoing embodiment where both are configured of a silicon oxide film. For example, the first oxide film 151 and the second oxide film 152 may be configured from different oxide films. For example, the first oxide film 151 may be configured of an aluminum oxide film and the second oxide film 152 may be configured of a silicon oxide film.

Furthermore, for example, although the channel protecting layer 150 exemplified in the foregoing embodiment as having a two-layered structure including the first oxide layer 151 and the second oxide layer 152, the channel protecting layer 150 is not limited to such structure. The channel protecting layer 150 may include three or more layers of oxide films. Specifically, a third oxide film may be stacked on the second oxide film 152.

Furthermore, although the organic EL display device 10 is described in the foregoing embodiment as a display device using the thin-film transistor 100 for example, the thin-film transistor 100 according to the foregoing embodiment can also be used in other display devices using an active-matrix substrate, such as a liquid crystal display device, etc.

Furthermore, display devices (display panels) such as the above-described organic EL display device 10 can be used as a flat panel display, and can be applied to various electronic devices having a display panel, such as television sets, personal computers, mobile phones, and so on. In particular, display devices (display panels) such as the above-described organic EL display device 10 are suitable for large screen and high-definition display devices.

As described above, exemplary embodiments are described as exemplifications of the technique according to the present disclosure. As such, the accompanying drawings and detailed description are provided for this purpose.

Therefore, the structural components described in the accompanying drawings and detailed description may include, not only structural components essential to solving the problem, but also structural elements that are not essential to solving the problem but are included in order to exemplify the aforementioned technique. As such, description of these non-essential structural components in the accompanying drawings and the detailed description should not be taken to mean that these non-essential structural elements are essential.

Furthermore, since the foregoing embodiments are for exemplifying the technique according to the present disclosure, various changes, substitutions, additions, omissions, and so on, can be carried out within the scope of the Claims or its equivalents.

Although only one exemplary embodiment of the present invention has been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The thin-film transistor substrate and the method of fabricating the same according to the present disclosure can be used, for example, in display devices such as organic EL display devices, and methods of fabricating the same.

The invention claimed is:

1. A method of fabricating a thin-film transistor substrate in which a thin-film transistor is formed on a substrate, the method comprising:
    forming an oxide semiconductor layer above the substrate;
    forming a first oxide film on the oxide semiconductor layer;
    performing an oxidation treatment on the oxide semiconductor layer, after the first oxide film is formed; and
    forming a second oxide film above the first oxide film, after the oxidation treatment is performed,
    wherein in the performing of the oxidation treatment, at least one parameter of the oxidation treatment is set, based on a predetermined relationship between the at least one parameter and a threshold value of the thin-film transistor, so that the threshold value becomes a predetermined value.

2. The method according to claim 1,
    wherein the oxidation treatment is a plasma treatment.

3. The method according to claim 2,
    wherein the at least one parameter includes a treatment time for which the plasma treatment is performed.

4. The method according to claim 2,
    wherein the at least one parameter includes a power density for the plasma treatment.

5. The method according to claim 2,
    wherein the at least one parameter includes a treatment time for the plasma treatment and a power density for the plasma treatment, and
    the predetermined relationship is a linear relationship between (i) a product of a power of the power density and the treatment time and (ii) the threshold value.

6. The method according to claim 5,
    wherein the predetermined relationship is a linear relationship between (i) the product of the square of the power density and the treatment time and (ii) the threshold value.

7. The method according to claim 2,
    wherein the plasma treatment is performed using nitrous oxide gas.

8. The method according to claim 2,
    wherein the plasma treatment is performed for a treatment time of at least 5 seconds and at most 15 seconds.

9. The method according to claim 1,
    wherein the first oxide film has a thickness of at least 5 nm and at most 40 nm.

10. The method according to claim 1,
    wherein the first oxide film comprises a silicon oxide film.

11. The method according to claim 1,
    wherein the oxide semiconductor layer comprises a transparent amorphous oxide semiconductor.

12. The method according to claim 1,
    wherein the oxide semiconductor layer comprises InGaZnO.

* * * * *